Figure 1:
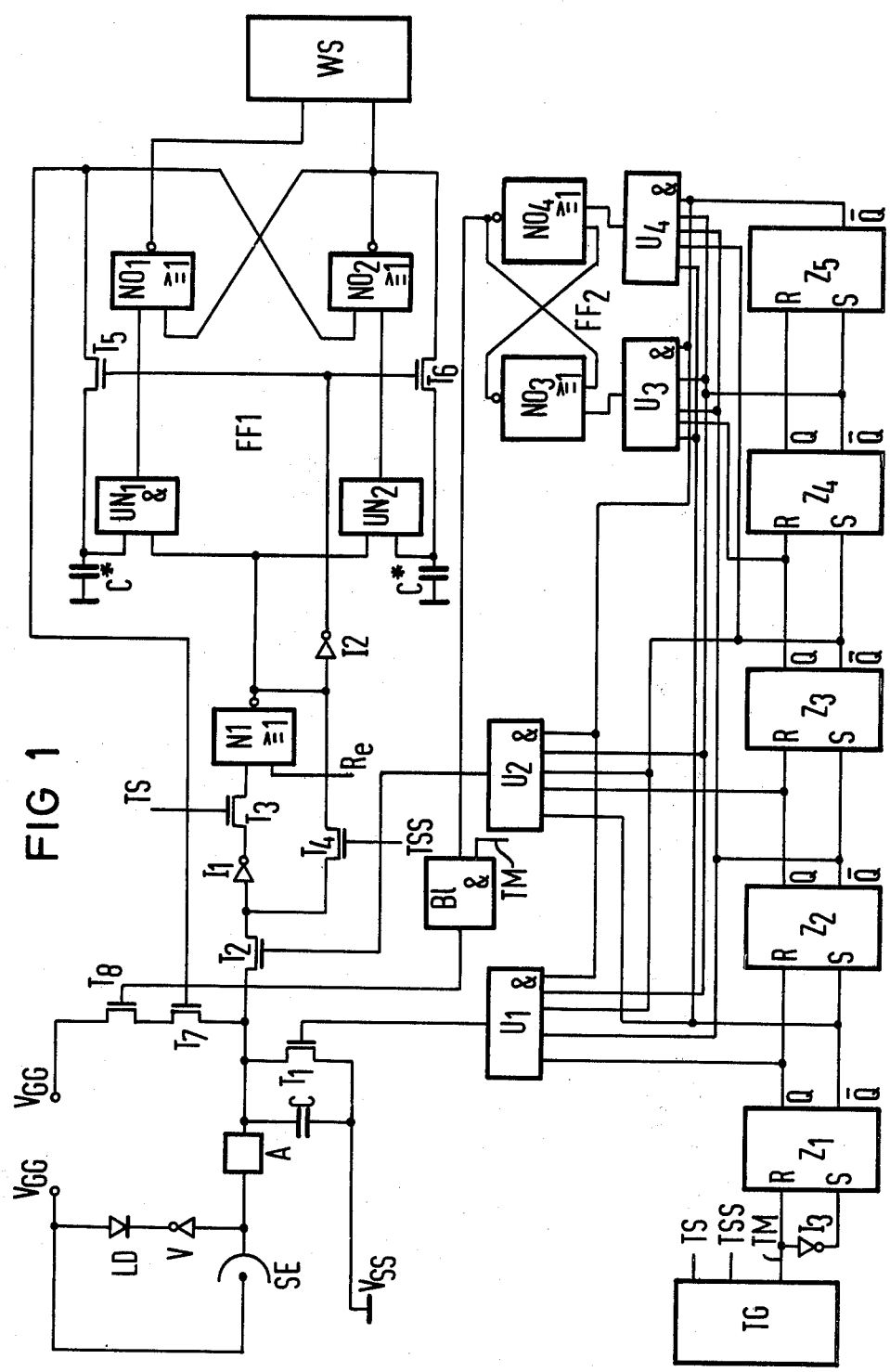

United States Patent [19]

Rösler et al.

[11] 4,316,104
[45] Feb. 16, 1982

[54] MONOLITHICALLY INTEGRATED DIGITAL SEMICONDUCTOR CIRCUIT

[75] Inventors: Helmut Rösler, Munich; Heimbert U. Irmer, Gladbeck; Klaus-Dieter Bigall, Vaterstetten, all of Fed. Rep. of Germany

[73] Assignee: Siemens Aktiengesellschaft, Berlin and Munich, Fed. Rep. of Germany

[21] Appl. No.: 144,035

[22] Filed: Apr. 28, 1980

[30] Foreign Application Priority Data

Apr. 30, 1979 [DE] Fed. Rep. of Germany ....... 2917596

[51] Int. Cl.³ .......................... H01V 3/38; H03K 3/26
[52] U.S. Cl. .................................. 307/308; 307/303; 307/311
[58] Field of Search .................. 307/308, 303, 311

[56] References Cited

U.S. PATENT DOCUMENTS 4,163,923  8/1979  Herbers .............................. 307/308
4,250,432  2/1981  Kohler ................................ 307/308
4,264,831  4/1981  Wern .................................. 307/308

*Primary Examiner*—Harold A. Dixon
*Attorney, Agent, or Firm*—Herbert L. Lerner; Laurence A. Greenberg

[57] ABSTRACT

Monolithically integrated digital semiconductor circuit formed on a semiconductor body and having MIS field-effect transistors and an electric terminal as signal input in the semiconductor body, including respective devices for applying two operating potentials to the digital semiconductor circuit, a manually actuatable sensor switch connecting the respective devices to the electric terminal for applying one of the operating potentials thereto, one of the MIS field-effect transistors having a source drain path and a control gate, the transistor being rendered conductive by an electric pulse applied to the gate thereof and the electric terminal being connected in the semiconductor body to the means for applying the other of the operating potentials thereto through the source-drain path of the transistor, an additional circuit component forming part of the digital semiconductor circuit and representing an AND function, the additional circuit component having at least one terminal connected to the electric terminal and being actuatable by an electric pulse applied thereto, and a pulse generating system connected to the gate of the transistor and to the additional circuit component for generating a respective pulse for activating the transistor and the additional circuit component, respectively.

20 Claims, 3 Drawing Figures

MONOLITHICALLY INTEGRATED DIGITAL SEMICONDUCTOR CIRCUIT

The invention relates to a monolithically integrated digital semiconductor circuit having MIS field effect transistors and an electrical terminal used as signal input on the semiconductor body containing the semiconductor circuit.

The invention is concerned with the problem of specifying a possibility of generating the electrical signal to be applied to the signal input by means of a so-called sensor switch. As is generally known, a sensor switch if formed of a first electrode to which one of the operating potentials of the semiconductor circuit is applied, and of a second electrode connected to the electrical terminal of the semiconductor body, the free path between the two electrodes having to be bridged by a resistance provided by the finger of the person actuating the sensor switch. Accordingly, an external signal is applied to the electrical terminal A of the semiconductor body only as long as the sensor switch is bridged by the body of the operating person.

It is desirable that the reception of the signal generated via the sensor switch be indicated by the digital semiconductor circuit through an appropriate response signal e.g. via a light-emitting diode. Towards this end and to serve contact pins, it is expedient and, in accordance with an object of the invention, to conduct the response signal likewise across the aforementioned terminal of the semiconductor body to the display which generally cannot be combined monolithically with the digital semiconductor circuit in one common semiconductor crystal.

With the foregoing and other objects in view, there is provided, in accordance with the invention, a monolithically integrated digital semiconductor circuit formed on a semiconductor body and having MIS field-effect transistors and an electric terminal as signal input in the semiconductor body, including respective means for applying two operating potentials to the digital semiconductor circuit, a manually actuatable sensor switch connecting the respective means to the electric terminal for applying one of the operating potentials thereto, one of the MIS field-effect transistors having a source drain path and a control gate, the transistor being rendered conductive by an electric pulse applied to the gate thereof and the electric terminal being connected in the semiconductor body to the means for applying the other of the operating potentials thereto through the source-drain path of the transistor, an additional circuit component forming part of the digital semiconductor circuit and representing an AND function, the additional circuit component having at least one terminal connected to the electric terminal, and being actuatable by an electric pulse applied thereto, and a pulse generating system connected to the gate of the transistor and to the additional circuit component for generating a respective pulse for activating the transistor and the additional circuit component, respectively.

It is the purpose of the first MIS field effect transistor, after each action, to prepare the circuit, and also the terminal A of the semiconductor body therewith, for the next action through charge equalization via the sensor switch. The other circuit component representing an AND function serves the purpose of transmitting the sensor signal to the digital semiconductor circuit per se to be activated by the sensor signal or to be controlled in some way. This other circuit component is preferably a second MIS field effect transistor. It is in turn, preferably wired as a transfer transistor for the sensor signal arriving via the terminal A.

In addition, the following measures, among others, may be provided and be advantageous:

(a) The pulse generating system is an oscillator-controlled binary counter which transmits, via a decoder, the individual pulse sequences to the first MIS field effect transistor and to the other circuit component representing an AND function.

(b) A shift register call or this other circuit component with AND function activates a flip-flop cell which serves, on the one hand, for further controlling the digital semiconductor circuit per se and, on the other hand, for generating a secondary signal which is to be applied to the aforementioned terminal A of the semiconductor body and can be used as confirmation of the arrival of the sensor signal at the integrated, digital semiconductor circuit per se.

In practice, the type of MIS field effect transistors to be used depends upon the technology used in the manufacture of the integrated circuit per se formed mainly of MIS field effect transistors also. Generally, however, MOS field effect transistors of the enhancement or enrichment type either in n-channel technology or in p-channel technology are used.

In accordance with another feature of the invention the additional circuit component comprises a second MIS field effect transistor having a source terminal thereof connected to the terminal of the semiconductor body and having the gate thereof controllable by the pulses from the pulse generating system, and the drain thereof connected to a circuit component forming part of the digital semiconductor circuit per se.

In accordance with a further feature of the invention the second MIS field effect transistor forms an input transfer transistor of a quasistatic shift register cell having an output for controlling other components of the digital semiconductor circuit.

In accordance with an additional feature of the invention the additional circuit component comprises an AND gate having a signal input thereof connected to the terminal of the semiconductor body and having a second terminal controllable by the pulses from the pulse generating system, the AND gate having an ouput for controlling a circuit component of the digital semiconductor circuit per se.

In accordance with an added feature of the invention the AND gate forms the input of a flip-flop shift register cell having outputs for controlling other components of the digital semiconductor circuit.

In accordance with yet another feature of the invention there is provided a circuit component responsive to the effect upon the semiconductor circuit of a signal applied via the sensor switch to the terminal of the semiconductor body, and replying with a secondary signal.

In accordance with yet a further feature of the invention the circuit component replying with the secondary signal comprises at least one flip-flop cell.

In accordance with yet another additional feature of the invention the output of the quasistatic shift register cell is connected to a first flip-flop cell for controlling the same, the flip-flop cell having means for controlling other circuit components of the integrated digital semiconductor circuit.

In accordance with yet an added feature of the invention there is provided a quasistatic shift register cell connected to a first flip-flop cell for controlling the same, the first flip-flop cell having means for controlling other circuit components of the integrated digital semiconductor circuit.

In accordance with an alternate feature of the invention the AND gate connected to the terminal of the semiconductor body forms an input of a flip-flop shift register having signal outputs for further controlling the digital semiconductor circuit.

In accordance with still a further feature of the invention the outputs of the flip-flop shift register cell serves to control a first flip-flop having an output for controlling an MIS field effect transistor for generating a reply signal, and a current-carrying terminal connected to the terminal of the semiconductor body.

In accordance with still an additional feature of the invention the flip-flop shift register cell has outputs serving to control a first flip-flop having an output for controlling an MIS field effect transistor for generating a reply signal, and a current-carrying terminal connected to the terminal of the semiconductor body.

In accordance with still an added feature of the invention the flip-flop shift register cell is a two-memo flip flop.

In accordance with still another feature of the invention the pulse generating system comprises a clock generator having a first signal output for delivering periodic first pulses and at least one second signal output for delivering second pulses which, though of the same frequency as the first pulses, are phase-shifted relative thereto, the second signal output furnishing a pulse sequence for controlling a shift register forming a path between the electric terminal and the digital circuit per se, the first signal output furnishing a pulse sequence applicable to the counting input of a binary counter.

In accordance with still a further feature of the invention the binary counter has outputs for transmitting a count, the binary-counter outputs being connected to a decoder having outputs for furnishing pulse sequences serving to control the first MIS field effect transistor and the additional circuit component.

In accordance with still an additional feature of the invention the flip-flop cell, controllable by a shift register inserted between the electric terminal and the further digital semiconductor circuit, has means for controlling an MIS field effect transistor for generating a secondary signal, and is connected to the terminal of the semiconductor body through one of the current-carrying terminals thereof.

In accordance with still an added feature of the invention the MIS transistor controllable by the first flip-flop cell and the current path crossing the transistor are additionally capable of being keyed by a further pulse sequence.

In accordance with still an alternate feature of the invention the gate of the transistor controllable by the first flip-flop cell is activatable by a pulse sequence generated by the binary counter with the aid of the decoder.

In accordance with a further feature of the invention the terminal of the semiconductor body is connected to the one of the operating potentials other than reference potential via the MIS field effect transistors connected in series with respect to the source-drain paths thereof, one of the outputs of the first flip-flop controlled by the sensor signal via the terminal of the semiconductor body and a shift register cell being applied to the gate of one of the MIS field effect transistors, the gate of the other of the MIS field effect transistors being controlled via a second flip-flop cell, the second flip-flop cell, in turn, being settable by the binary counter via the decoder.

In accordance with a concomitant feature of the invention there is provided a light-emitting diode activatable via an amplifier forming an external component of the circuit, the light-emitting diode being activatable by the secondary signal conducted via the terminal of the semiconductor body.

Other features which are considered as characteristic for the invention are set forth in the appended claims.

Although the invention is illustrated and described herein as embodied in a monolithically integrated digital semiconductor circuit, it is nevertheless not intended to be limited to the details shown, since various modifications and structural changes may be made therein without departing from the spirit of the invention and within the scope and range of equivalents of the claims.

Figure 2:
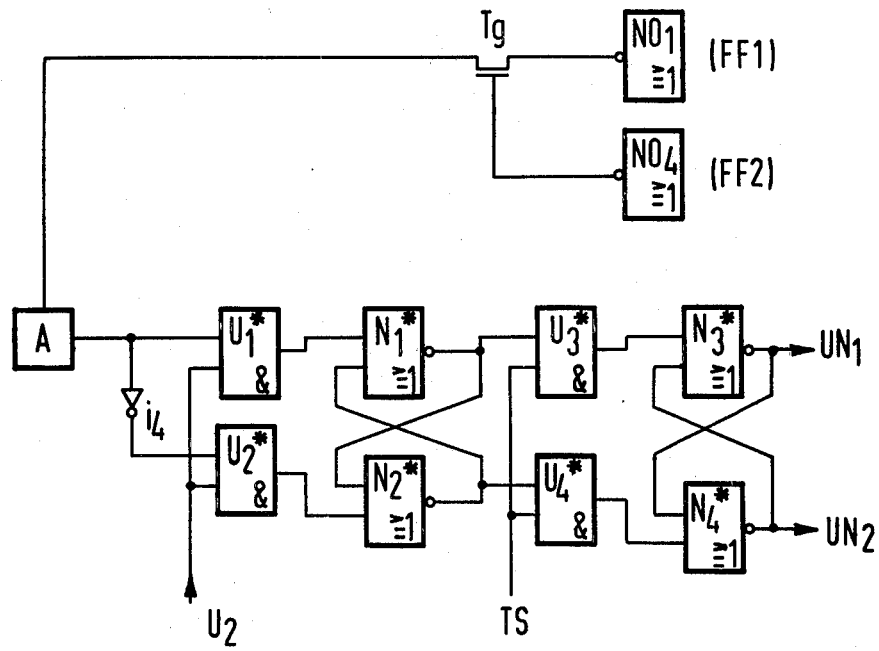
Figure 3:
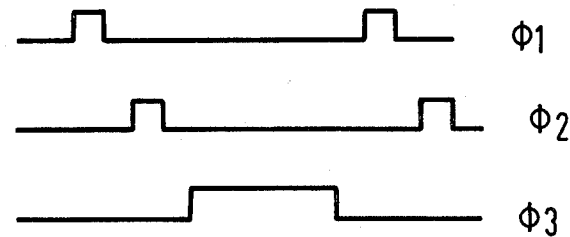

The construction and method of operation of the invention, however, together with additional objects and advantages thereof will be best understood from the following description of specific embodiments when read in connection with the accompanying drawings, in which:

FIG. 1 is a circuit diagram of a preferred embodiment of the invention wherein a second MIS field effect transistor, wired as a transfer transistor, is used as the other circuit component with AND function and wherein, in addition, the input of the digital circuit per se is represented by a quasistatic shift register cell;

FIG. 2 is a circuit diagram of a static shift register cell serving as replacement of the quasistatic register cell used in the circuit according to FIG. 1; and FIG. 3 is a plot diagram showing the time relationship of the pulses controlling the first MIS field effect transistor and the second MIS field effect transistor relative to each other and relative to the response signal furnished by the circuit.

Referring now to the drawing and first, particularly, to FIG. 1 thereof, there is shown that, in the system according to the invention, that one of the operating potentials provided for the operation of the overall system, namely the potential $V_{GG}$, is applied by means of a sensor switch SE to the terminal A of a semiconductor crystal, especially a silicon crystal, using the body of the person operating the circuit as a bridging resistance and, in this manner, generating a signal addressing the digital semiconductor circuit.

Between the second operating potential $V_{SS}$ i.e. the reference potential, connected to the circuit via ground, and the terminal A, a capacitance is usually provided, indicated by the capacitor C. Circuitwise, the capacitor C may be an MOS capacitor or may exist on purely parasitic basis only.

The capacitance C is bridged by the source-drain path of a first MIS field effect transistor $T_1$ having a gate which is controlled by a pulse sequence $\phi_1$ shown in the first plot diagram of FIG. 3. The terminal A is also connected to the source of a second MIS field effect transistor $T_2$ which forms the path from the terminal A into the digital semiconductor circuit and, hence, the path for the signal furnished by the sensor switch SE.

In the embodiment shown in FIG. 1, the second MIS field effect transistor $T_2$ is the input transfer transistor $T_2$ of a quasistatic shift register call having an output which is provided for controlling a toggle flip-flop $FF_1$ and, via the latter, for controlling the further components WS of the digital semiconductor circuit. The second MIS field control transistor $T_2$ is controlled, via the gate thereof, by the pulse sequence $\phi_2$ shown in the second plot diagram of FIG. 3.

To form a quasistatic shift register cell, the drain of the second MIS transistor $T_2$ is connected, via an inverter $I_1$ and a third MIS field effect transistor $T_3$, controlled via the gate thereof by a clock sequence TS and wired as a transfer transistor to the one input of a NOR gate $N_1$. The other input of this NOR gate $N_1$ can be controlled by a reset signal Re. Moreover, the drain of the second MIS field effect transistor $T_2$ is connected, via a fourth MIS field effect transistor $T_4$ controlled via the gate thereof by a pulse sequence $T_{SS}$, to the output of the aforementioned NOR gate $N_1$ and, hence, to the signal output of the quasistatic shift register cell.

The flip-flop cell $FF_1$ is made up of a master part and a slave part, essentially provided by the two AND gates $UN_1$ and $UN_2$, and by the two additional NOR gates $NO_1$ and $NO_2$, respectively. To control the master part, each of the two inputs, respectively, of each of the two AND gates $UN_1$ and $UN_2$ is connected directly to the output of the NOR gate $N_1$ and, thereby, to the output of the quasistatic shift register cell. The slave part of $FF_1$ is controlled in that the outputs of the two AND gates $UN_1$ and $UN_2$ of the master part are each connected to one of the two inputs of the slave part formed by the two cross-coupled NOR gates $NO_1$ and $NO_2$. The two outputs of the NOR gates $NO_1$ and $NO_2$, forming a base flip-flop (NOR latch) due to the cross-coupling, each form a signal output of the toggle flip-flop $FF_1$, provided to switch and control other components WS of the digital semiconductor circuit per se to be constructed in accordance with the existing requirements. In addition, each of the two outputs, respectively, of the flip-flop $FF_1$ is fed back, via the source-drain path of additional MIS field effect transistors $T_5$ and $T_6$, respectively, to the other input of a respective one of the two AND gates $UN_1$ and $UN_2$ in the master part. The gates of the two transistors $T_5$ and $T_6$ are controlled by the output of the quasistatic shift register cell, i.e. the output of the NOR gate $N_1$, with the interposition of a converter $L_2$.

Also provided within the semiconductor crystal containing the digital semiconductor circuit is the series circuit formed of two more MIS field effect transistors $T_7$ and $T_8$, by means of which the electrical terminal A of the semiconductor crystal can be connected to an operating potential differing from the ground potential $V_{SS}$, especially to the potential $V_{GG}$ serving to activate the sensor switch SE. For this purpose, the transistor $T_7$ located closer to the terminal A, is controlled via the gate thereof by the non-inverted output of the toggle flip-flop $FF_1$ whereas the gate of the transistor $T_8$ is connected to the inverting output of an RS flip-flop $FF_2$.

A system which generates a clock cycle TM as well as a clock cycle TSS is used as clock generator TG. Such a system is described, for example, in co-pending U.S. application Ser. No. 72,975 field on or about Sept. 5, 1979. This system is capable of generating three phase-shifted periodic clock pulse sequences TM, TS, and TSS. The clock sequence TM is formed of timewise equidistant square-wave pulses of the logic lever "1". The same applies to the clock sequence TS which has the same frequency as that of the sequence TM. However, the pulses of the sequence TM are phase-shifted relative to the pulses of the sequence TS so that the pulses TS are of the "1" state only if the sequence TM is of the "U" state. In addition, a non-disappearing time difference is provided between the flanks of the individual pulses TM and the respective, timewise adjacent individual pulses TS. The individual pulses of the sequence TSS coincide timewise with the individual pulses of the sequence TS which applies exactly to the transitions from logic "1" to logic "0". On the other hand, the individual pulses of the sequence TSS have, in contrast to the pulses TS, transitions from logic "0" to logic "1" which rise at a noticeable inclination and, accordingly, a noticeable shortened duration of the logic "1" level in comparison to that of the pulse TS.

The clock sequence TS of such a clock generator, suited especially for clock quasistatic shift register, is used, in a semiconductor circuit according to FIG. 1 conforming to the invention, for the control of the fourth MIS field effect transistor $T_4$ and, hence, of the direct path from the drain of the second MIS transistor $T_2$ and the output of the NOR gate $N_1$. The clock sequence TS serves to control the third MIS field effect transistor $T_3$ and, hence, of the one input of the NOR gate $N_1$. The clock sequence TM, on the other hand, is used to activate a binary counter DZ.

This binary counter DZ is formed of a chain of series-connected flip-flop cells $Z_1$ to $Z_5$, each of which has an input which can be controlled non-inverted and an input which can be controlled inverted i.e. two inputs R and S, as well as two corresponding outputs Q and $\overline{Q}$. The two outputs Q and $\overline{Q}$ of the counting stage $Z_i$, respectively, preceding in the chain are connected to a respective one of the two inputs of the respectively succeeding counting stage $Z_{i+2}$.

The individual counting stages $Z_1$ are constructed according to the flip-flop cell $FF_1$, for example. The pulses to be counted, such as the pulses TM, for example, go directly to the one input and, via an inverter $I_3$, to the other input of the first counting stage $Z_1$ of the binary counter DZ. The output Q and $\overline{Q}$ of the individual counting stages $Z_1$ transmit the count of the respectively reached binary counter DZ, taking into consideration the order i of the calls $Z_1$. These outputs serve for the activation of a decoding circuit, by means of which the pulse sequences $\phi_1$ and $\phi_2$ required for the control of the two MIS field effect transistors $T_1$ and $T_2$, as well as the pulses required for control of the previously mentioned RS flip-flop $FF_2$ are obtained.

In the case of the illustrated embodiment, the binary counter DZ has five counting stages $Z_1$-$Z_5$ and can, therefore, count up to $Z^6$ pulses before it resets to the initial state. Generally, the binary counter has n counting stages $Z_1$ to $Z_n$.

According to FIG. 1, the decoder has a first AND gate $U_1$ with give inputs and an output by which it is connected to the gate of the first MIS field effect transistor $T_1$, the first AND gate U, being connected by the inputs thereof to a respective one of the inverted outputs $\overline{Q}$ of the five counting stages $Z_1$ to $Z_5$ which are provided. Generally, the first AND gate $U_1$ has n signal inputs in accordance with the number n of counting stages of the binary counter DZ, the $\overline{Q}$ outputs of the counting stages of DZ being connected to a respective one of the inputs of the AND gate $U_1$.

In the case of the embodiment shown in FIG. 1, a second AND gate $U_2$ serving to control the MIS transistor $T_2$ leading from the terminal A of the semiconductor body into the quasistatic shift register cell and, thereby, into the digital semiconductor circuit has five inputs. With the exception of one input, they are connected to the $\overline{Q}$ outputs, while the input mentioned as the exception is connected to a Q output, the arrangement in the case of the illustrated embodiment being that the $\overline{Q}$ output of the first, the third, the fourth and fifth counting stages and the Q output of the second counting stage $Z_2$ are applied to a respective input of the second AND gate $U_2$. In the general case, with n counting stages $Z_1$, the second AND gate also has n inputs, it being advisable here too that the non-inverting output Q of the second call $Z_2$ and the inverting outputs $\overline{Q}$ of the other calls $Z_i$ of the binary counter DZ be applied to a respective input of the second AND gate $U_2$.

The output of the first of these AND gates i.e. the AND gate $U_1$, furnishes the $\phi_1$ pulses, and the output of the AND gate $U_2$ the $\phi_2$ pulses. The connection described has the advantages that the pulses $\phi_1$ and the $\phi_2$ have the same frequency.

Two more AND gates $U_3$ and $U_4$ serve the purpose of setting the RS flip-flop $FF_2$. In the case of the embodiment according to FIG. 1, these two AND gates $U_3$ and $U_4$ also have five inputs. One input of the AND gate $U_3$ is connected to the output Q of the third counting stage $Z_3$, and one input of the fourth AND gate $U_4$ to the output Q of the fourth counting stage $Z_4$, while the other inputs of the AND gate $U_3$ are connected to the $\overline{Q}$ output of a respective one of the counting stages $Z_1$, $Z_2$, $Z_4$ and $Z_5$, and the other inputs of the AND gate $U_4$ to the $\overline{Q}$ output of a respective one of the counting stages $Z_1$, $Z_2$, $Z_3$ and $Z_5$.

Thus, a given count is coded out to switch the RS flip-flop into the one state thereof and a second count is selected to switch the RS flip-flop $FF_2$ back into the initial state thereof again. The same applied also to the general case wherein a counter DZ with n counting stages is used.

The RS flip-flop $FF_2$ is formed of the two cross-coupled NOR gates $NO_3$ and $NO_4$, the still-open input of the NOR gate $NO_3$ being controlled by the AND gate $U_3$, and the still-open input of the NOR gate $NO_4$ by the output of the AND gate $U_4$. The output of the NOR gate $NO_4$ is connected to the gate of the transistor $T_8$.

In the interest of avoiding interference, it may be expedient to equip each one of the AND gates $U_1$, $U_2$, $U_3$, and $U_4$ forming the decoder with an additional input each, to which are then applied directly the counting pulses at the counting input i.e. the TM pulses, for example.

The capacitances C* shown in FIG. 1 are generally of parasitic nature. Circuitwise, however, they supplement the toggle flip-flop $FF_1$, by means of which the input of the two AND gates $UN_1$ and $UN_2$ of the master part of $FF_1$, not controlled by the NOR gate $N_1$ by the outputs of $FF_1$, is pulled or drawn to the reference potential $V_{SS}$.

The sensor switch SE is a component which supplements the circuit, but cannot be monolithically combined with the other circuit components due to its nature. Other external circuit components are provided by the display to be activated by the secondary signals applied to the terminal A via the transistors $T_7$ and $T_8$. This display may, for example, be of light-emitting diode LD, preceded by an amplifier V, disposed outside of the semiconductor chip, and forming, like the sensor switch SE, a structural unit with the integrated semiconductor circuit.

The amplifier V, constructed as an inverter, is supplied by the two operating potentials $V_{GG}$ and $V_{SS}$, the inputs of the amplifier V being connected to the terminal A and the output of the amplifier V to the cathode of the light-emitting diode LD, the anode of which carries the potential $V_{GG}$.

The thus fully described circuit according to FIG. 1, operates as follows:

Upon actuation of the sensor switch SE, the potential $V_{GG}$ is applied to the terminal A of the semiconductor chip through the person actuating the sensor switch, thereby initiating and effecting a gradual charging of the capacitor C. The instant the transfer transistor $T_2$ is activated by the AND gate $U_2$ through the signal $\phi_2$, the potential $V_{GG}$ i.e. the potential of a logic "1", is written via the inverter $I_1$ into a parasitic capacitor given by the transistor $T_3$.

With the appearance of the next counting pulse TM following the activation of the AND gate $U_2$ in the decoder, the transfer transistor $T_2$ is blocked again and thereby cut off. The transistor $T_3$ goes into conduction with the next pulse of the clock sequence TS, and the logic "1" furnished by the sensor switch SE is transmitted to the NOR gate $N_1$, at the output of which the information appears as a logic "0". This causes the connection provided by the two transistors $T_5$ and $T_6$ between the output of the slave and the input of the master part of the flip-flop $FF_1$ to be closed via the inverter $I_2$, and the potential of the logic "1" is applied to the master part of the flip-flop $FF_1$. This causes the information generated via the sensor switch SE to be transmitted to the other circuit components WS of the digital semiconductor circuit so that the intended control action can take place there.

Due to the activation of the master part in the flip-flop $FF_1$, the latter flips into the other operating state, whereby not only the circuit components WS are controlled, but the transistor $T_2$ is driven into conduction also. Due to the further progress of the counting operation in the binary counter DZ, the RS flip-flop $FF_2$ is finally caused by the AND gate $U_3$ to flip, whereby the transistor goes into conduction. This causes the potential $V_{GG}$ to be supplied to the terminal A via the two transistors $T_7$ and $T_8$ and the secondary signal $\phi_3$ shown in the third plot diagram of FIG. 3. Due to the arrival of more counting pulses at the counting input of the counter DZ, the flip-flop $FF_2$ is finally flipped back through the AND gate $U_4$, and the terminal A is disconnected again from the $V_{GG}$ potential. The binary counter DZ then starts a new counting period, thereby giving the transistor $T_1$ the opportunity to reduce the charge stored in the capacitor C and to pull or draw the terminal A to the potential i.e. ground, and thus to the potential of the logic "0".

The response signal $\phi_3$, shown as the last plot diagram in FIG. 3 and generated by opening the two transistors $T_2$ and $T_8$, serves to activate the display. Since the input of the amplifier then carries the potential "1" and the output of the amplifier the potential "0", the full difference of the potentials $V_{GG}$ and $V_{SS}$ is applied between anode and cathode of the light-emitting diode LD so that the diode LD responds. The AND gate 81 shown in FIG. 1 and inserted between the output of the NOR gate $NO_4$ and the gate of the transistor $T_8$ can be brought into the conductive or forward state by rapid pulses so that the response signal $\phi_3$ is keyed. The light-emitting diode LD then blinks in rhythm with these blink signals, such as given by the counting clock TM and applied to the other input of the AND gate 81. In the absence of the AND gate 81, the diode LD is steadily lit during the length of the $\phi_3$ signals.

The respective potential present at the terminal A i.e. the logic "1" state or the logic "0" state, is transmitted to the quasistatic shift register with every $\phi_2$ pulse. The flip-flop $FF_1$ flips back into the initial state thereof only after the output of the NOR gate $N_1$ has changed its logic state, which is possible only after the sensor switch has been released. The consequence of such a release is that a "1" is transmitted to the input of the NOR gate $N_1$ with the next $\phi_2$ pulse so that an "0" is present at its output. If the sensor switch SE is then actuated again, the next "1" appears at the output of $N_1$ and, thereby, the next pulse capable of flipping the flip-flop $FF_1$ back into the initial state thereof. With this, the sequence of the secondary signals $\phi_3$ also expires. To reactivate the cycle, the sensor switch must be actuated again i.e. for the third time.

The circuit shown in FIG. 1 employs a quasistatic shift register cell between the terminal A and the digital circuit per se which is to be controlled. Instead of a quasistatic shift register cell may also be used. A suitable circuit is shown in FIG. 2.

By using this flip-flop shift register cell according to FIG. 2, it is possible not only to eliminate the components forming part of the quasistatic shift register cell, namely, the components $T_2$, $T_3$, $T_4$, $T_1$, $T_2$, and $N_1$ but also to replace the transistors $T_7$ and $T_8$ by one MIS field effect transistor $T_9$, which can be acted upon in a different manner by the two flip-flops $FF_1$ and $FF_2$. Moreover, in addition to these two flip-flops $FF_1$ and $FF_2$, the binary counter DZ also remains. Nor are the external circuit components such as the digital circuit per se thereby subject to any change.

In the embodiment of the device according to the invention as shown, in part, in FIG. 2, the terminal A of the semiconductor body is connected to the one input of a first AND gate $U_1^*$ and, via an inverter $I_4$, to the one input of a second AND gate $U_2^*$. The two other inputs of these two AND gates are controlled by the $\phi_2$ pulses furnished by the AND gate $U_2$ of the decoder in FIG. 1. As a further component of a first flip-flop cell of the shift register, the input section (master) made up of the two AND gates $U_1^*$ and $U_2^*$ is followed by a NOR latch formed of the two cross-coupled NOR gates $N_1^*$ and $N_2^*$. The outputs of this first flip-flop cell serve to control a second indentical flip-flop cell, the input AND gates $U_3^*$ and $U_4^*$ of which are controlled, in addition to the aforementioned outputs of the first flip-flop cell of the shift register cell, by a shift clock signal TS. The outputs of the two AND gates $U_3^*$ and $U_4^*$ control a second NOR latch, formed of the two cross-coupled NOR gates $N_3^*$ and $N_4^*$, the two outputs of which being connected directly to a respective one of the inputs of the two AND gates $UN_1$ and $UN_2$ of the toggle flip-flop $FF_1$ not coupled to the output of $FF_1$.

The non-inverting output i.e. the output of the NOR gate $NO_1$ of the flip-flop cell $FF_1$, is connected to the source terminal of the previously mentioned MIS field offset transistor $T_9$, the drain of which is connected to the terminal A. The gate of the transistor $T_9$ is controlled by the output of the flip-flop cell $FF_2$ in a manner corresponding to the control of the transistor $T_8$ in a system constructed in accordance with FIG. 1.

The clock generator TG can be simplified in comparison with the clock generator to be used in an arrangement according to FIG. 1 because only the counting clock for the binary counter DZ and the clock generator TS for the activation of the two AND gates $U_3^*$ and $U_4^*$ in the input section of the second flip-flop cell of the shift register according to FIG. 2 are needed. It is advantageous to use a clock generator as described in German Patent Application P 27 13 319.3 (VPA 77 P 1027), filed Mar. 25, 1977 under the title "Electronic Clock Generator for Electrical Digital Systems". The clock cycle furnished by this clock generator TM again serves advantageously as counting clock for binary counter DZ while the clock cycle for the clock generator TS is used in the manner just described.

The operating mode of the digital semiconductor circuit modified by the circuit components according to FIG. 2 essentially corresponds to that of the unmodified embodiment according to FIG. 1. When starting the operation of the system, the terminal A carries the operating potential $V_{SS}$ corresponding to the logic "0". Due to the first actuation of the sensor switch, there arrives at the input of the first flip-flop cell of the flip-flop shift register a switching pulse by which this flip-flop cell and, upon the next TS pulse, also the second flip-flop cell of the shift register and the toggle flip-flop $FF_1$ are flipped into the other operating state thereof. The transistor $T_9$ accordingly receives a source-drain voltage. Therefore, the two clock signals $\phi_2$ and TS effect activation of the transistor $T_9$ which, in this state, finally goes into conduction at the next flipping of $FF_2$ (caused by the binary counter DZ and the AND gate $U_3$) so that the light-emitting diode LD lights up.

More again, the activation of the light-emitting diode is concluded only when the sensor switch SE is actuated for the second time. Reactivation requires a third actuation of the sensor switch SE, as is the case in a device according to FIG. 1.

The preferred embodiment of the device according to the invention are shown in FIGS. 1 and 2 is suited in particular for application in an electronic organ.

There are claimed:

1. Monolithically integrated digital semiconductor circuit formed on a semiconductor body and having MIS field-effect transistors and an electric terminal as signal input in the semiconductor body, comprising respective means for applying two operating potentials to the digital semiconductor circuit, a manually actuatable sensor switch connecting said respective means to the electric terminal for applying one of said operating potentials thereto, one of the MIS field-effect transistors having a source drain path and a control gate, the transistor being rendered conductive by an electric pulse applied to said gate thereof and said electric terminal being connected in the semiconductor body to said means for applying the other of said operating potentials thereto through the source-drain path of the transistor, an additional circuit component forming part of the digital semiconductor circuit and representing an AND function, said additional circuit component having at least one terminal connected to said electric terminal and being activatable by an electric pulse applied thereto, and a pulse generating system connected to said gate of said transistor and to said additional circuit component for generating a respective pulse for activating said transistor and said additional circuit component, respectively.

2. Device according to claim 1 wherein said additional circuit component comprises a second MIS field effect transistor having a source terminal thereof connected to the terminal of the semiconductor body and having the gate thereof controllable by the pulses from said pulse generating system, and the drain thereof connected to a circuit component forming part of the digital semiconductor circuit per se.

3. Device according to claim 2 wherein said second MIS field effect transistor forms an input transfer transistor of a quasistatic shift register cell having an output for controlling other components of the digital semiconductor circuit.

4. Device according to claim 3 wherein said output of said quasistatic shift register cell is connected to a first flip-flop cell for controlling the same, said flip-flop cell having means for controlling other circuit components of the integrated digital semiconductor circuit.

5. Device according to claim 1 wherein said additional circuit component comprises an AND gate having a signal input thereof connected to the terminal of the semiconductor body and having a second terminal controllable by the pulses from said pulse generating system, said AND gate having an output for controlling a circuit component of the digital semiconductor circuit per se.

6. Device according to claim 5 wherein said AND gate forms the input of a flip-flop shift register cell having outputs for controlling other components of the digital semiconductor circuit.

7. Device according to claim 6 including a circuit component responsive to the effect upon the semiconductor circuit of a signal applied via said sensor switch to the terminal of the semiconductor body, and replying with a secondary signal.

8. Device according to claim 7 wherein said circuit component replying with said secondary signal comprises at least one flip-flop cell.

9. Device according to claim 6 wherein said outputs of said flip-flop shift register cell serves to control a first flip-flop having an output for controlling an MIS field effect transistor for generating a reply signal, and a current-carrying terminal connected to the terminal of the semiconductor body.

10. Device according to claim 8 including a quasistatic shift register cell connected to a first flip-flop cell for controlling the same, said first flip-flop cell having means for controlling other circuit components of the integrated digital semiconductor circuit.

11. Device according to claim 10 wherein said flip-flop shift register cell has outputs serving to control a first flip-flop having an output for controlling an MIS field effect transistor for generating a reply signal, and a current-carrying terminal connected to the terminal of the semiconductor body.

12. Device according to claim 9 or claim 11 wherein said flip-flop shift register cell is a two-memory flip-flop.

13. Device according to claim 5 wherein said AND gate connected to the terminal of the semiconductor body forms an input of a flip-flop shift register having signal outputs for further controlling the digital semiconductor circuit.

14. Device according to claim 8 wherein said flip-flop cell, controllable by a shift register inserted between said electric terminal and the further digital semiconductor circuit, has means for controlling an MIS field effect transistor for generating a secondary signal and is connected to the terminal of the semiconductor body through one of said current-carrying terminals thereof.

15. Device according to claim 14 wherein said MIS transistor controllable by said first flip-flop cell and the current path crossing said transistor are additionally capable of being keyed by a further pulse sequence.

16. Device according to claim 14 wherein the gate of the transistor controllable by said first flip-flop cell is activatable by a pulse sequence generated by the binary counter with the aid of said decoder.

17. Device according to claim 16 including a light-emitting diode activatable via an amplifier forming an external component of the circuit, said light-emitting diode being activatable by the secondary signal conducted via the terminal of the semiconductor body.

18. Device according to claim 1 wherein said pulse generating system comprises a clock generator having a first signal output for delivering periodic first pulses and at least one second signal output for delivering second pulses which, though of the same frequency as said first pulses, are phase-shifted relative thereto, said second signal output furnishing a pulse sequence for controlling a shift register forming a path between said electric terminal and the digital circuit per se, said first signal output furnishing a pulse sequence applicable to the counting input of a binary counter.

19. Device according to claim 18 wherein said binary counter has outputs for transmitting a count, said binary counter outputs being connected to a decoder having outputs for furnishing pulse sequences serving to control said first MIS field effect transistor and said additional circuit component.

20. Device according to claim 8 or claim 19, wherein the terminal of the semiconductor body is connected to the one of said operating potentials other than reference potential via said MIS field effect transistors connected in series with respect to the source-drain paths thereof, one of the outputs of said first flip-flop controlled by the sensor signal via the terminal of the semiconductor body and a shift register cell being applied to the gate of one of said MIS field effect transistors, the gate of the other of said MIS field effect transistors being controlled via a second flip-flop cell, said second flip-flop cell, in turn, being settable by said binary counter via said decoder.

* * * * *